(12) United States Patent
Shoda

(10) Patent No.: US 7,600,167 B2
(45) Date of Patent: Oct. 6, 2009

(54) FLIP-FLOP, SHIFT REGISTER, AND SCAN TEST CIRCUIT

(75) Inventor: Hiroaki Shoda, Tokyo (JP)

(73) Assignee: NEC Corporation, Tokyo (JP)

( * ) Notice: Subject to any disclaimer, the term of this patent is extended or adjusted under 35 U.S.C. 154(b) by 379 days.

(21) Appl. No.: 11/727,451

(22) Filed: Mar. 27, 2007

(65) Prior Publication Data

US 2007/0245185 A1    Oct. 18, 2007

(30) Foreign Application Priority Data

Mar. 28, 2006    (JP) .............................. 2006-089503

(51) Int. Cl.
| | |
|---|---|
| G01R 31/28 | (2006.01) |
| G01R 31/26 | (2006.01) |
| G06F 1/00 | (2006.01) |
| G11C 29/00 | (2006.01) |
| H03K 3/289 | (2006.01) |
| H03K 3/00 | (2006.01) |
| H03K 5/13 | (2006.01) |
| H03H 11/16 | (2006.01) |
| H03K 19/00 | (2006.01) |
| H03K 21/00 | (2006.01) |
| H03K 23/00 | (2006.01) |
| H03K 25/00 | (2006.01) |
| H03K 3/02 | (2006.01) |

(52) U.S. Cl. ................. 714/726; 714/724; 714/731; 714/718; 714/729; 713/500; 327/202; 327/203; 327/238; 327/218; 327/255; 327/115; 327/198; 375/344; 375/355; 326/16; 365/201; 324/765

(58) Field of Classification Search .................. None
See application file for complete search history.

(56) References Cited

FOREIGN PATENT DOCUMENTS

| | | |
|---|---|---|
| JP | 11-174123 | 7/1999 |
| JP | 2003-43114 | 2/2003 |
| JP | 2004-37264 | 2/2004 |

*Primary Examiner*—Kevin Ellis
*Assistant Examiner*—Guerrier Merant
(74) *Attorney, Agent, or Firm*—Young & Thompson

(57) ABSTRACT

A flip-flop has a first latch and a second latch. The first latch has a first feedback circuit and a first selecting circuit which selects one of a first data input signal and an output signal of the first feedback circuit, based on the logic level of a first clock signal. The second latch has a second feedback circuit and a second selecting circuit which selects an output signal of the first latch and an output signal of the second feedback circuit based on the inverted logic level in case of the first latch. The first feedback circuit has a third selecting circuit which selects one of an output signal of the first latch and a second data input signal based on the logic level of a second clock signal, and outputs a signal selected by the third selecting circuit to the first selecting circuit.

20 Claims, 10 Drawing Sheets

US 7,600,167 B2

FLIP-FLOP, SHIFT REGISTER, AND SCAN TEST CIRCUIT

BACKGROUND OF THE INVENTION

1. Field of the Invention

The present invention relates to a flip-flop (hereinafter referred to as a "FF"), a shift register, and a scan test circuit, and more particularly, to an FF including a plurality of data input pins, a shift register using the FFs, and a scan test circuit using the FFs.

2. Description of the Related Art

A scan test has been known as a method of testing a logic circuit. In the scan test, all FFs included in the logic circuit to be tested are connected in series to construct a single long shift register (hereinafter also referred to as a scan path). Next, output signals of combinational logic circuits included in the logic circuit are held by respective bits of the shift register. The signals held by the shift register are successively outputted to the outside in response to a scan clock. The outputted signal is compared with an expected value to determine the presence or absence of defect of an internal circuit.

A structure of a scan FF used for the scan test is partially different from that of a normal FF. Examples of an operation mode of the scan FF include a scan mode which is a mode for the scan test and a normal mode which is a normal operation mode. The scan FF includes data input pins used for the respective modes.

FIG. 7 shows an example of an internal circuit of a conventional scan FF. The scan FF includes selectors SEL 11, SEL 12, and SEL 13 and inverters INV 21, INV 22, INV 23, INV 24, INV 25, and INV 26. An FF section of the scan, FF is composed of two latches, that is, a master latch LAT 1 and a slave latch LAT 2. The selector SEL 12 and INV 21 and INV 22 compose the master latch LAT 1. The selector SEL 13 and INV 23 and INV 24 compose the slave latch LAT 2.

The scan FF further includes a data input pin Din used for the normal mode and a scan data input pin Sin used for the scan mode. SEL 11 selects data in response to a mode selection signal Sft. In the normal mode, data from Din is selected and inputted to LAT 1. In the scan mode, scan data from Sin is selected and inputted to LAT 1. LAT 2 holds an output of LAT 1 and outputs data from each of a data output pin Dout and an inverted data output pin Dout*.

As described above, unlike the normal FF, according to the scan FF circuit shown in FIG. 7, SEL 11 is provided on a signal path. Therefore, in the normal mode, a propagation delay of a signal from a circuit located at a preceding stage of the scan FF increases, so that a high-speed operation of a logic circuit using the scan FF is inhibited.

In the scan mode, a data output signal of a preceding stage scan FF which operates at a clock signal in phase with the clock signal of the scan FF is inputted from Sin. At this time, a hold time for holding data in the scan FF is sometimes insufficient. Then, a hold error occurs, and the scan test cannot be performed. In order to prevent the occurrence of the hold error, a delay buffer for delay compensation is inserted into the scan path in some cases. However, the insertion of the delay buffer and the addition of wirings required therefor cause the deterioration of placement and routing of a large scale integrated (LSI) circuit.

The fact that the scan FF causes the hold error because the hold time for an input signal of the scan FF in the scan mode is insufficient will be described with reference to a timing diagram. As shown in FIG. 8, it is assumed that the scan path includes two scan FFs (scanFF-1 and scanFF-2) connected in series, each of which is the FF shown in FIG. 7. FIG. 9 is a timing diagram in the scan mode during the normal operation. FIG. 10 is a timing diagram showing a state in which a hold error is caused in the scan FF. Each of FIGS. 9 and 10 shows signal changes at Sin, the points a and b shown in FIG. 7, and Dout in each of scanFF-1 and those in scanFF-2 from the top to the bottom.

During the normal operation in the scan mode, as shown in FIG. 9, scan data S0, S1, and S2 inputted to Sin are successively shifted through LAT 1 and LAT 2 in each of the two scan FFs of the scan path in response to a clock signal Clk. In the timing diagrams, each portion in which a signal state is expressed by "X" indicates that a signal at each time does not influence the circuit operation, that is, the signal is "Don't Care". When Clk=1 (Clk*=0) at a timing 0 (t0), SEL 13 changes a signal to be selected from an output signal (identical to a signal obtained by inverting a signal at the point b) of LAT 1 to an output signal (identical to a signal obtained by inverting a signal at Dout of LAT 2). Then, during a period between the time of starting the change of the signal to be selected and a timing 1 (t1) when a hold time Th of LAT 2 is completed, the scan data S0 is held at Sin of scanFF-2, so that a signal at the point a in LAT 1 of scanFF-2 is also the scan data S0. Therefore, the master latch LAT 1 of scanFF-2 latches the scan data S0 at t0 and LAT 2 of scanFF-2 receives the scan data S0 at t0. Thus, the scan data S0 can be normally outputted from Dout.

As shown in FIG. 10, the case where the hold error occurs is that the scan data S0 at Sin of scanFF-2 when Clk=1 (Clk*=0) at t0 is changed into the scan data S1 at t1. That is, the input signal to Sin doesn't satisfy the hold time of LAT 1 at t0 when LAT 1 of scanFF-2 latches the signal at the point a. Therefore, LAT 1 of scanFF-2 cannot latch the scan data S0 at t0, so that the scan data S1 is latched thereby and inputted into LAT 2 of scanFF-2 at t0. Thus, scanFF-2 outputs not the normal scan data S0 but the scan data S1 from the data output pin Dout.

As described above, the scan FF shown in FIG. 7 has a problem that, when a signal is propagated from a preceding stage scan FF in the normal mode, a propagation delay between FFs lengthens to inhibit an increase in speed because the selector is inserted into the signal path. In addition, there is a problem that, in the scan mode, an output from a preceding stage scan FF operating at an in-phase clock signal cannot satisfy a hold time at the scan data input pin to cause the hold error, so that a normal scan test cannot be performed in some cases. A problem occurs in that, when the delay buffer is inserted to prevent the occurrence of the hold error, the number of wirings increases to deteriorate the placement and the routing.

Up to now, techniques related to various scan tests have been disclosed. For example, Japanese Patent Application Laid-open No. 2003-043114 (hereinafter referred to as D1) discloses a scan FF and a scan test circuit including scan FFs which are cascaded. In the scan FF disclosed in D1, a clock signal specifying a scan data capture timing and a clock signal specifying a scan data output timing are clock signals whose phases are different from each other. Therefore, according to this description, in the scan test circuit including the scan FFs which are cascaded, a scan data output is held even after a next stage scan FF captures scan data, so that a data hold time can be reserved.

Japanese Patent Application Laid-open No. 2004-037264 (hereinafter referred to as D2) discloses a scan FF in which a latch circuit for capturing data only during a high-level period of a clock signal Clk and holding the captured data for a low-level period thereof is provided in a scan input pin. According to this description, in the scan test circuit using the scan FF, even when a clock signal Clk inputted to a subsequent stage scan FF is delayed relative to a clock signal Clk inputted to a preceding stage scan FF, no malfunction occurs.

Japanese Patent Application Laid-open No. Hei 11-174123 (hereinafter referred to as D3) discloses a scan FF including an input data holding circuit for holding a logic value at an input pin before the arrival of an edge of a synchronizing signal. In the scan FF described in D3, a timing when the logic value at the input pin is held by the input data holding circuit is optimized according to a skew of the synchronizing signal, thereby avoiding the hold error.

However, each of the above-mentioned conventional techniques has a problem. That is, a selector or a multiplexer for the scan test is provided on a signal line for the normal mode in each of the scan FF described in D1, D2, and D3. When the selector is inserted into the signal line for the normal mode, the high-speed operation of the circuit is hindered as described above. Therefore, in the scan test FF described in each of D1, D2, and D3, although the problem related to the hold time is solved, the problem related to an increase in speed is not solved.

SUMMARY OF THE INVENTION

The present invention was made to solve the foregoing and other exemplary problems, drawbacks, and disadvantages of the conventional structures.

In view of the problems, drawbacks, and disadvantages, an exemplary feature of the present invention is to provide a scan FF in which inhibition of an increase in speed with an increase in signal propagation delay of a scan FF internal section is prevented in a normal mode.

In an exemplary embodiment of the present invention to attain the above and other exemplary purposes, a flip-flop includes a first latch which includes a first feedback circuit which feedbacks a output signal of the first latch to an input of the first latch, and a first selecting circuit which selects a first data input signal when a first clock signal is a first logic level and selects an output signal of the first feedback circuit when the first clock signal is a first inverted logic level of the first logic level, and a second latch which includes a second feedback circuit which feedbacks a output signal of the second latch to an input of the second latch, and a second selecting circuit which selects an output signal of the first latch when the first clock signal is the first inverted logic level and selects an output signal of the second feedback circuit when the first clock signal is the first logic level. The first feedback circuit comprises a third selecting circuit which selects an output signal of the first latch when a second clock signal is a second logic level and selects a second data input signal when the second clock signal is a second inverted logic level of the second logic level, and outputs a signal selected by the third selecting circuit to the first selecting circuit.

The scan FF according to the present invention does not include a selector, which is inserted into a conventional scan FF, for selecting data inputted during a normal mode or data inputted during a scan mode. Therefore, in the present invention, there is an advantage that an increase in signal propagation delay which is caused by the selector can be prevented in the normal mode to realize the high-speed operation of a logic circuit using the scan FF.

BRIEF DESCRIPTION OF THE DRAWINGS

The above and other exemplary purposes, features and advantages of the present invention will become more apparent form the following detailed description when taken in conjunction with the accompanying drawings wherein.

DETAILED DESCRIPTION OF THE EXEMPLARY EMBODIMENTS

1. First Exemplary Embodiment

Figure 1:
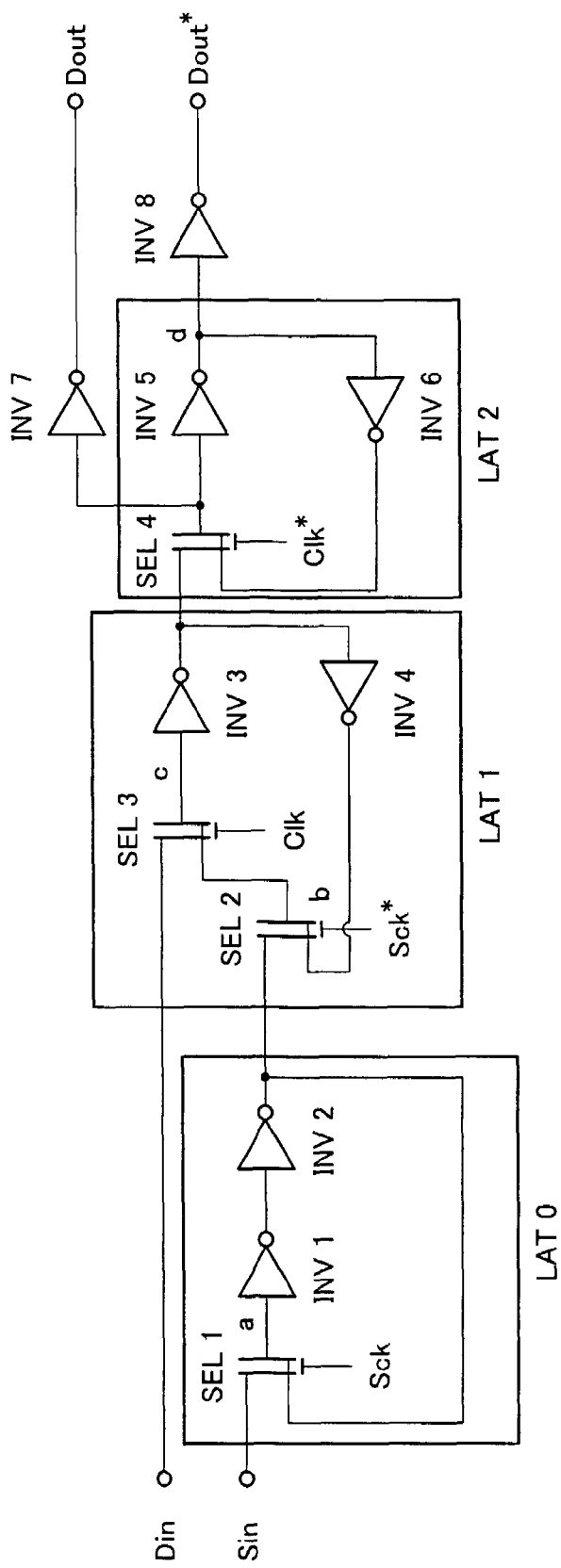
FIG. 1 is a circuit diagram showing an internal structure of a scan FF according to a first exemplary embodiment of the present invention.
Figure 2:
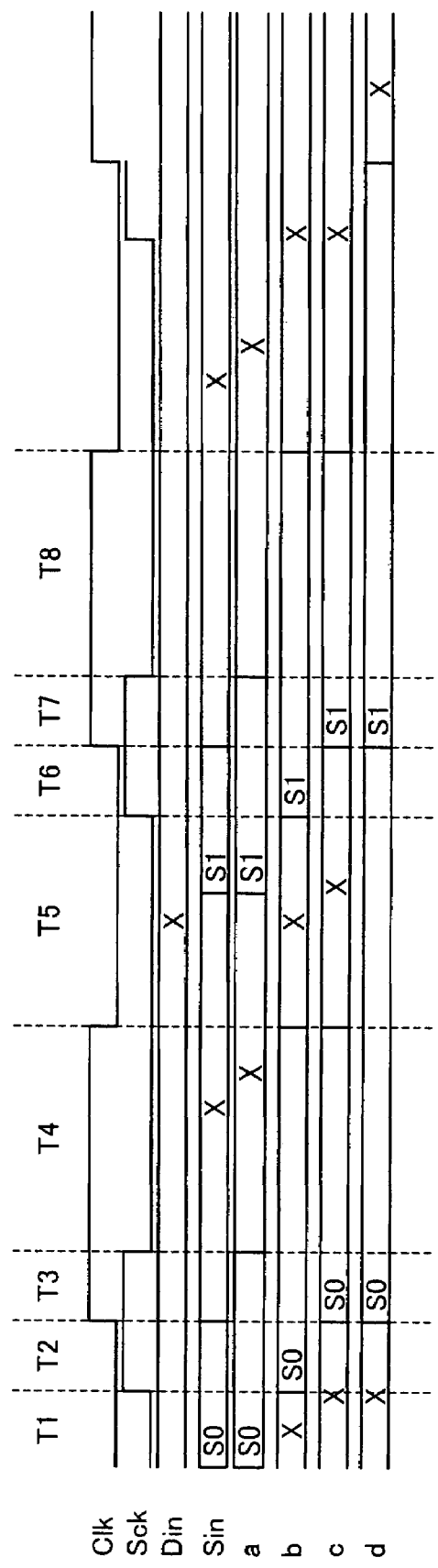
FIG. 2 is a timing diagram showing the transition of the signals in a scan mode of the scan FF according to the first exemplary embodiment of the present invention.
Figure 3:
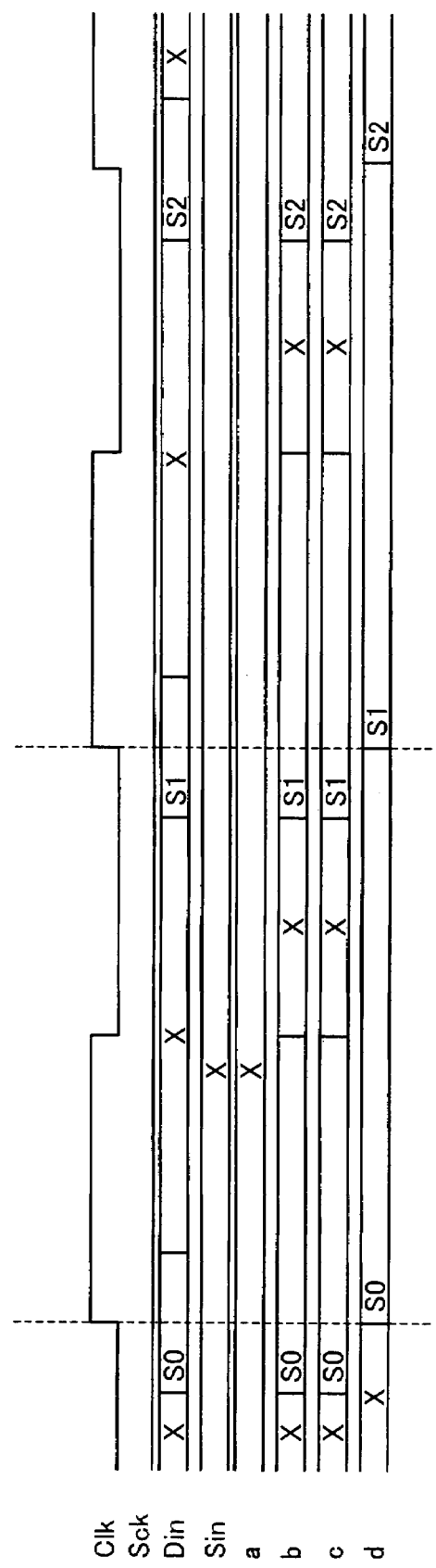
FIG. 3 is a timing diagram showing the transition of the signals in a normal mode of the scan FF according to the first exemplary embodiment of the present invention.

FIG. 1 is a circuit diagram showing a structure of a scan FF according to a first exemplary embodiment of the present invention. FIG. 2 is a timing diagram showing the transition of the signals in a scan mode of the scan FF according to the first exemplary embodiment. FIG. 3 is a timing diagram showing the transition of the signals in a normal mode of the scan FF according to the first exemplary embodiment.

As shown in FIG. 1, the scan FF according to the first exemplary embodiment includes selectors SEL 1, SEL 2, SEL 3, and SEL 4 and inverters INV 1, INV 2, INV 3, INV 4, INV 5, INV 6, INV 7, and INV 8. SEL 1, INV 1 and INV 2 compose a latch LAT 0. SEL 2, SEL 3, INV 3 and INV 4 compose a latch LAT 1. SEL 4, INV 5 and INV 6 compose a latch LAT 2. LAT 1 is a master latch of the scan FF and LAT 2 is a slave latch of the scan FF.

In FIG. 1, reference symbol Din denotes a data input pin for a normal mode during a normal operation. Reference symbol Dout denotes a data output pin of the scan FF which is used for the normal mode and the scan mode. Reference symbol Dout* denotes an inverted data output pin from which inverted data of data outputted from the data output pin Dout is outputted. Reference symbol Clk denotes a clock signal for the normal mode. Reference symbol Sin denotes a scan data input pin for the scan mode. Reference symbol Sck denotes a scan clock signal for the scan mode. Reference symbol Sck* denotes a scan clock signal obtained by inverting Sck.

When Sck=0, SEL 1 selects input data selectively inputted to Sin, so that 0 supplies the input data to SEL 2 through INV 1 and INV 2. When Sck=1, SEL 1 selects an output of INV 2, so that INV 1, INV 2 and SEL 1 form a feedback loop of LAT 0. Therefore, the 0 holds the input data inputted to pin Sin.

LAT 1 includes two selectors, that is, SEL 2 whose selection signal is Sck* and SEL 3 whose selection signal is Clk. When Sck*=0, SEL 2 selects an output of LAT 0. When Sck*=1, SEL 2 selects an output of INV 4. When Clk=0, SEL 3 selects the data at Din. When Clk=1, SEL 3 selects an output of SEL 2 to output it to INV 3. Therefore, LAT 1 has two selection inputs (Sck* and Clk).

Next, the operation of LAT 1 will be described with reference to the cases of state combinations of the selection inputs (Sck* and Clk).

When Clk=0, SEL 3 selects the data at Din without depending on a level of Sck*. Therefore, LAT 1 outputs an inverted signal of the data at Din to LAT 2 through INV 3.

When Clk=1 and Sck*=0, SEL 2 selects the output of LAT 0 to output it to SEL 3. The selector SEL 3 selects the output of SEL 2, that is, the output of LAT 0, to output an inverted signal of the output of LAT 0 to LAT 2 through INV 3.

When Clk=1 and Sck*=1, SEL 2 selects the output of INV 4 to output it to SEL 3. Then, SEL 3 selects the output of SEL 2, that is, the output of INV 4. At this time, the last output of LAT 1 (last output of INV 3) is held because INV 3 and INV 4 and SEL 2 and SEL 3 form a feedback loop. The held value is outputted to LAT 2.

When Clk*=0, LAT 2 receives the output of LAT 1 (output of INV 3). At this time, an inverted signal of the output of LAT 1 is outputted to the data output pin Dout through INV 7. The signal from LAT 1 is outputted to the inverted data output pin Dout* through INV 5 and INV 8 without any change. When Clk*=1, LAT 2 holds the output value of LAT 1 because INV 5 and INV 6 and SEL 4 form a feedback loop.

The value held by LAT 2 is outputted as the output of the scan FF from the data output pin Dout. In addition, an inverted value of the held value is outputted as an inverted output of the scan FF from the inverted data output pin Dout*.

Next, the operation of the scan FF according to the first exemplary embodiment will be described. To simplify the description, when SEL 1, SEL 2, SEl3, and SEL 4 are operated, all delay times are neglected. That is, it is assumed that each of a time between a change in level of a selected input signal and a change in output signal and a time between a change in selection signal and a change in output signal is 0. In addition, it is assumed that an output delay time of each of INV 1, INV 2, INV 3, INV 4, INV 5, and INV 6 is 0. In the timing diagrams, each portion in which a signal state is expressed by "X" indicates that a signal at each time does not influence the circuit operation, that is, the signal is "Don't Care".

The operation of scan FF according to the first exemplary embodiment in the scan mode will be described with reference to FIGS. 1 and 2. The scan data outputted from a preceding stage scan FF is inputted to Sin. The selection input (Sck) of SEL 1 for a period T1 is 0, so that SEL 1 selects the scan data inputted to Sin. A signal S0 inputted to Sin is outputted to a point a shown in FIG. 1.

For a period T2 in which Sck=1, SEL 1 selects the output of INV 2. At this time, the signal at the point a is fed back through INV 1 and INV 2 and SEL 1. Then, LAT 0 becomes a data hold state, so that the signal S0 is held. In addition, Sck*=0, so that SEL 2 selects the output of LAT 0. The signal S0 whose level is equal to that at the point a is outputted to a point b.

For a period T3, Clk=1, so that SEL 3 selects the signal at the point b. The signal S0 is outputted to a point c. In addition, Clk*=0, so that SEL 4 selects the signal at the point c. The signal S0 is outputted to a point d.

For a period T4, Sck*=1 and Clk=1, so that SEL 2 selects the output of INV 4 to output it to the point b and SEL 3 selects the signal at the point b. Therefore, the feedback loop which is composed of SEL 2 and SEL 3 and INV 3 and INV 4 is formed, with the result that the signal S0 at the point c is held. Because Clk*=0, SEL 4 continuously selects the signal at the point c, so that the signal S0 is continuously outputted to the point d.

Next, for periods T5 and T6, Clk*=1, so that SEL 4 and INV 5 and INV 6 form a feedback loop. Therefore, LAT 2 holds the signal S0, so that the signal S0 is continuously outputted to the point d. For a period T7 and subsequent periods, the scan FF shown in FIG. 1 repeats the following operation. That is, scan data from the preceding stage scan FF is inputted from Sin. The scan data is sequentially held by LAT 1 and LAT 2 and then outputted to the data output pin Dout.

As described above, upon receiving the signals Sck and Clk, the scan FF shown in FIG. 1 sequentially shifts the scan data and outputs the scan data to a next stage scan FF. Therefore, the scan test can be performed using the scan FF shown in FIG. 1.

Figure 7:
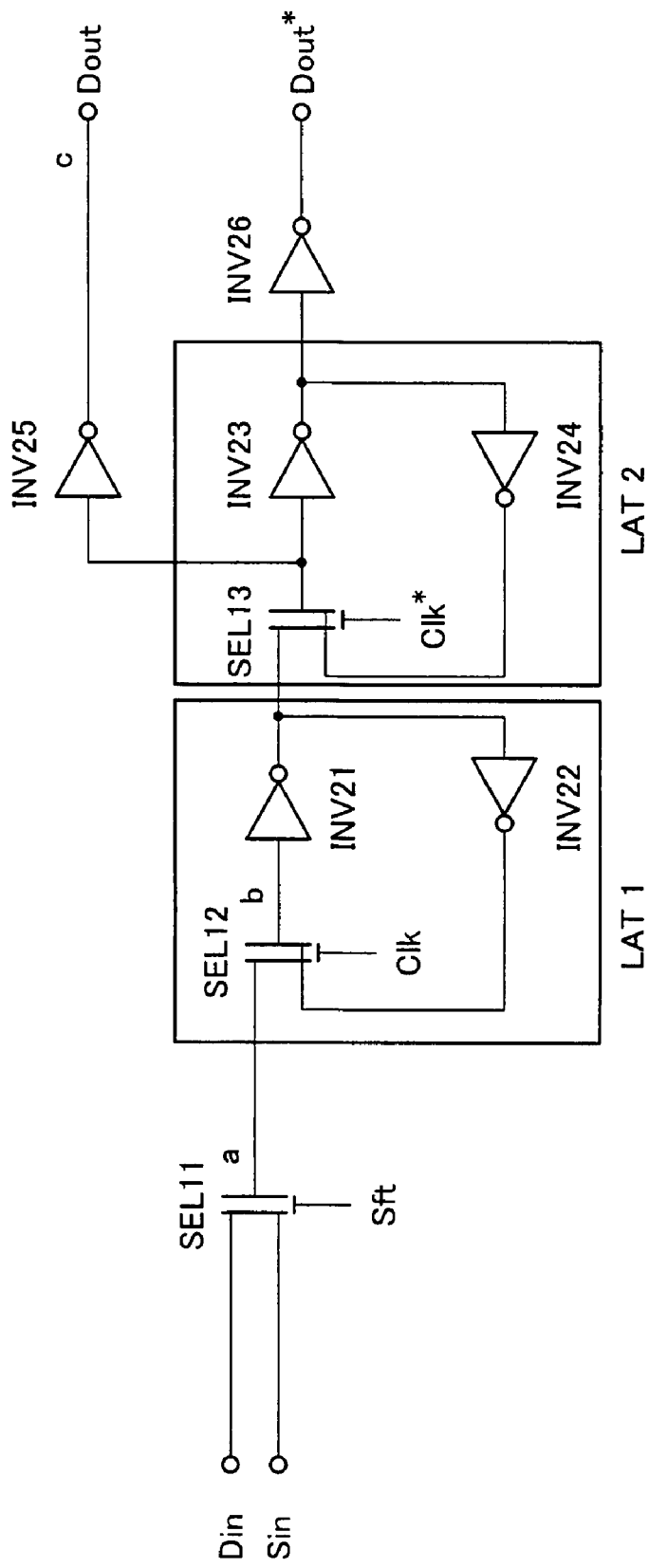
FIG. 7 is a circuit diagram showing a structure of a conventional scan FF.
Figure 8:
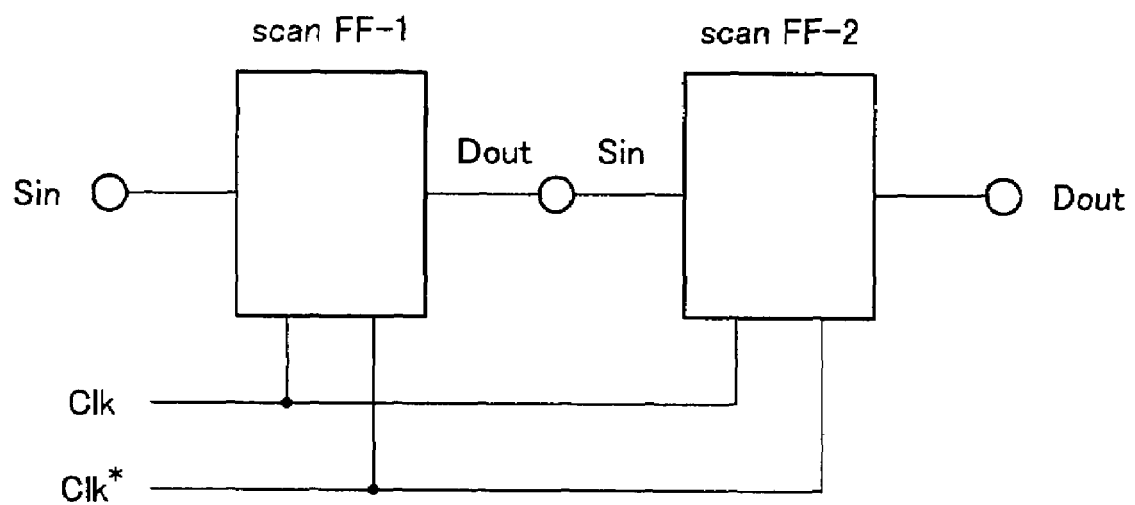
FIG. 8 is a block diagram showing a structure of a scan path using the conventional scan FF.
Figure 9:
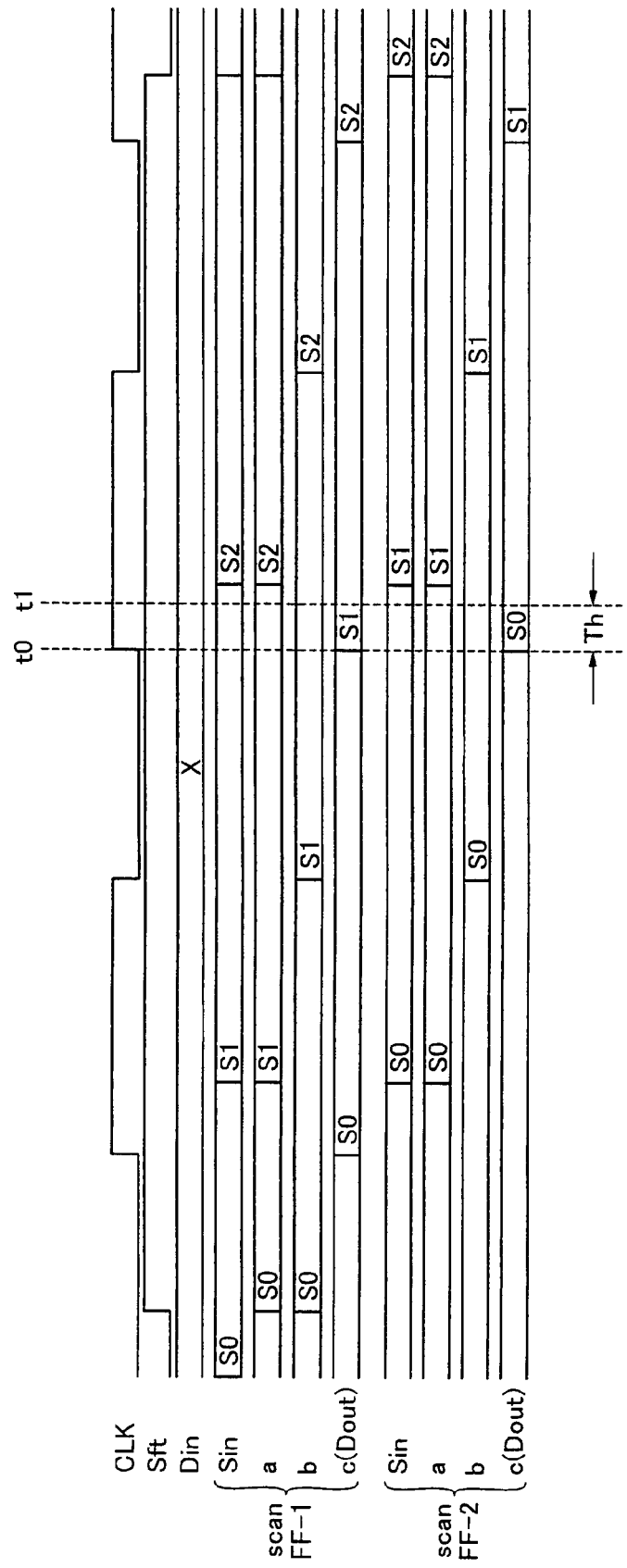
FIG. 9 is a timing diagram showing the transition of the signals in a scan mode during a normal operation of the conventional scan FF.
Figure 10:
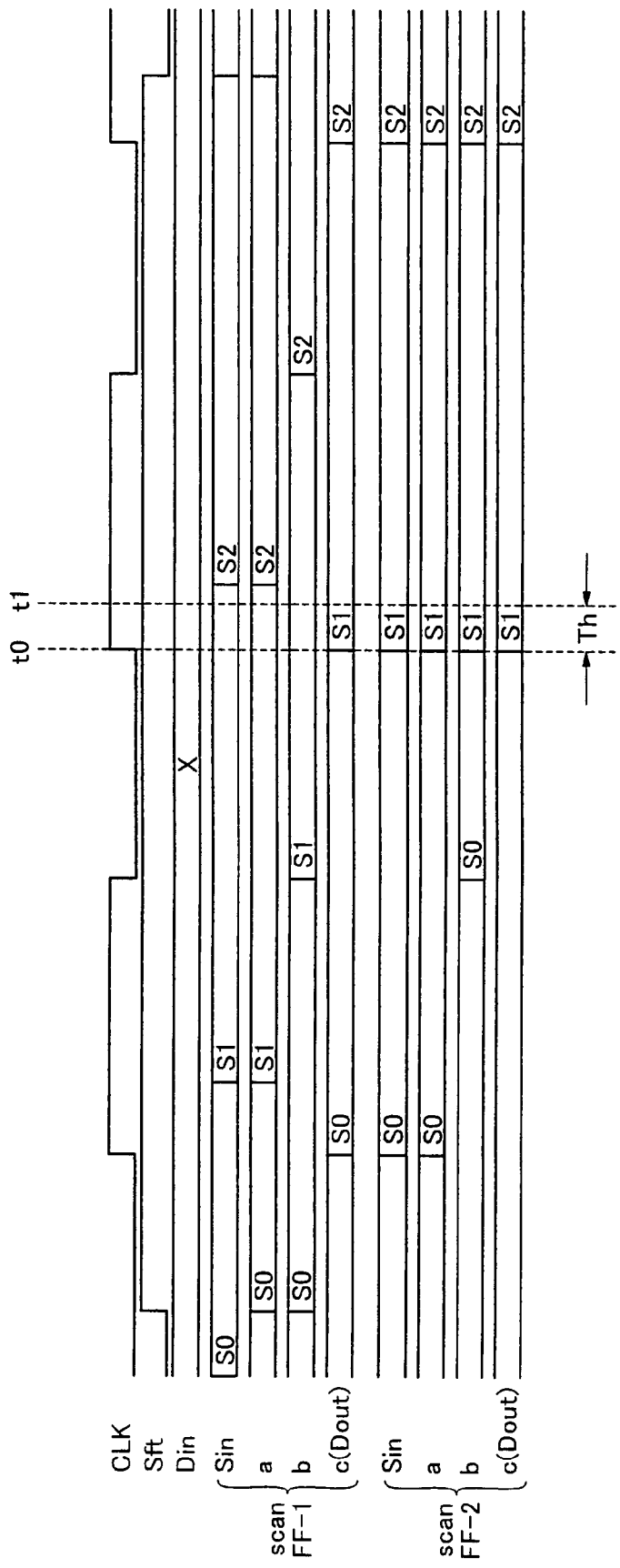
FIG. 10 is a timing diagram showing the transition of the signals in the scan mode in a case where a hold error occurs in the conventional scan FF.

A hold time of a signal inputted to LAT 1 in the scan mode is reserved during a period of "Sck=1" by holding the signal at Sin by LAT 0. That is, on the rising edge of the signal Clk which is a timing when LAT 1 starts to receive the signal at the point b (start timing of each of the periods T3 and T7), Sck=1, so the signal inputted to LAT 1 is the signal at Sin and does not change. Therefore, the problem caused by the hold time in the conventional scan FF as shown in FIG. 7 does not occur in the scan FF according to this exemplary embodiment.

Next, the operation of scan FF according to the first exemplary embodiment in the normal mode will be described with reference to FIGS. 1 and 3. In the normal mode, it is assumed that Sck=0 and Sck*=1. At this time, SEL 2 constantly selects the signal from INV 4. Therefore, LAT 1 operates as a normal latch which is composed of SEL 3 and INV 3 and INV 4. In other words, the scan FF shown in FIG. 1 operates as a simple FF which is composed of LAT 1 and LAT 2 without having Sin. In this case, only SEL 3 and SEL 4 are provided on a path between Din and the data output pin Dout on which an input signal travels, so that the same structure as that of the FF section of the scan FF shown in FIG. 7 is obtained.

When Sck=0, LAT 0 is held to a latch state. Therefore, the power consumption of LAT 0 is minimized.

As described above, LAT 0 for holding the scan data input signal inputted to Sin is provided in the scan FF according to the first exemplary embodiment. The selector required for the scan test up to now is removed from the logic data path for the normal mode. The selector SEL 3 is inserted into the feedback loop of the master latch LAT 1 included in the scan FF. The control input for scan test (Sck*) is commonly used as the control signal of the selection circuit. Thus, the following effects are obtained.

According to the first exemplary embodiment, the selector inserted into the path of the data from the data input pin for the normal mode up to now is removed. Therefore, there is an effect that the signal propagation delay of the internal section of the scan FF is minimized to improve the operating speed of a logic circuit using the scan FF according to this exemplary embodiment.

According to the first exemplary embodiment, the latch for holding the scan data input signal inputted to the scan data input pin is provided, so that it is possible to prevent a malfunction caused by the hold error during the scan mode. Therefore, there is an effect that it is unnecessary to insert a delay buffer for delay compensation into the scan path and thus a problem in which placement and routing deteriorate does not occur.

According to the first exemplary embodiment, the scan clock is fixed for the normal mode. Therefore, there is an effect that unnecessary power consumption of the latches for holding the scan data does not occur.

The first exemplary embodiment of the present invention is described in detail with reference to the drawings. A specific structure is not limited to the structure described in this exemplary embodiment and thus design modifications and the like which are made without deviating from the spirit of the present invention are included in the present invention. For example, kinds of logic elements for each of the latches are not limited to those described in this exemplary embodiment. Other kinds of logic circuits capable of performing the same operation as that in this exemplary embodiment may be used. For example, normal buffers, which output the same signal level as the input signal level, can be used instead of INV 1, 2, 3, 4, 5 and 6.

The latch LAT 0 in the first exemplary embodiment is used to prevent the occurrence of the hold error in the case where the scan path is constructed using the scan FF. Therefore, LAT 0 is not a constituent element essential to the present invention. When the hold time can be sufficiently reserved, a scan FF which does not include LAT 0 and includes LAT 1 and LAT 2 may be used. Even in this case, it is possible to obtain an effect that the signal propagation delay of the internal section of the scan FF is minimized to improve the operating speed of a logic circuit using the scan FF according to the present invention.

2. Second Exemplary Embodiment

Each of the latches of the scan FF according to the first exemplary embodiment includes the selector. The selector has the function of selecting one of the output signal of the preceding stage circuit and the output signal of the current latch as the input signal of each of the latches. Therefore, it is only necessary that the selector of each of the latches be a circuit having a signal selecting function, so that the selector can be constructed using various circuits. In other words, it is only necessary that the function be substantially identical to that of the "selector". Thus, it is unnecessary that the selector be a circuit which is called a "selector" or a "multiplexer" which is a synonym thereof.

Note that the operating speed of the entire logic circuit using the scan FF is limited by the signal propagation delay of the circuit having the signal selecting function. Therefore, it is necessary to prevent an increase in signal propagation delay of the signal passing through the selector.

Figure 4:
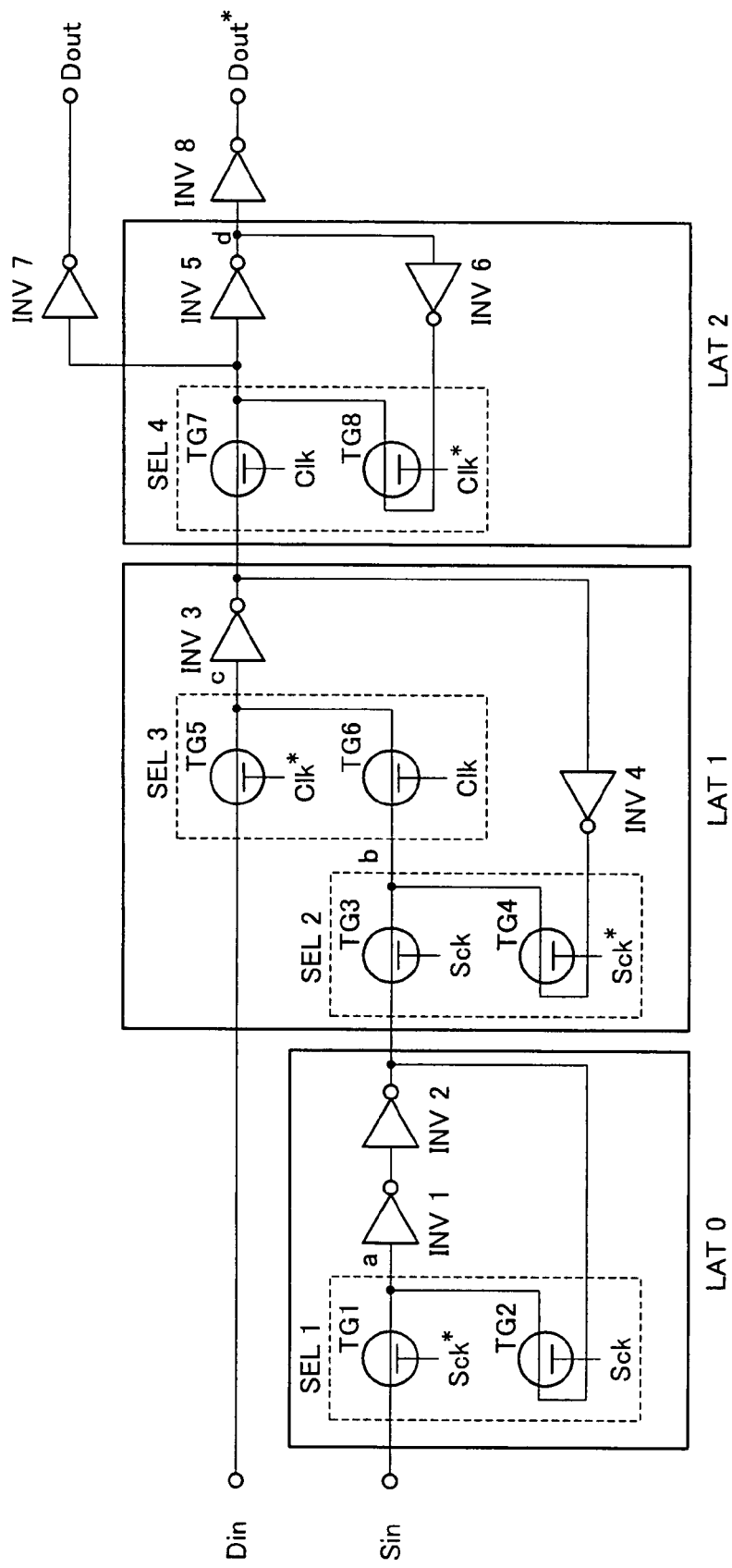
FIG. 4 is a circuit diagram showing an internal structure of a scan FF according to a second exemplary embodiment of the present invention.

In a scan FF shown in FIG. 4, each selector includes two transmission gates. Each of the transmission gates is a kind of switch and includes two signal pins and a control pin. When an input signal (control input) inputted to the control pin is in an active level, the transmission gate becomes an on-state, so that the two signal pins are electrically connected with each other. When the control input is in an inactive level, the transmission gate becomes an off-state, so that the signal is blocked between the two signal pins.

A circuit structure of the transmission gate is very simple. For example, in the case of a CMOS process, it is only necessary to connect an N-channel MOS transistor and a P-channel MOS transistor in parallel. When a reduction in amplitude of a transferred signal and a reduction in operating speed are not problematic, the transmission gate may be only one of an N-channel MOS transistor and a P-channel MOS transistor.

When a pin of one of two transmission gates is connected with a pin of the other thereof, a selector including two input pins, an output pin, and two control input pins is completed. Each of the selectors SEL 1, SEL 2, SEL 3, and SEL 4 as shown in FIG. 4 is the selector having the above-mentioned structure. Transmission gates TG 1 and TG 2 compose SEL 1. Transmission gates TG 3 and TG 4 compose 2. Transmission gates TG 5 and TG 6 compose SEL 3. Transmission gates TG 7 and TG 8 compose SEL 4. The signals Sck and Sck* are inputted to the two control input pins of SEL 1, so that one of the two transmission gates is exclusively turned on, that is, only one thereof becomes an on-state. Each of SEL 2, SEL 3, and SEL 4 is connected with one of a group including pins for the signals Sck and Sck* and a group including pins for the signals Clk and Clk*, so that the one of two transmission gates is exclusively turned on, that is, only one thereof becomes an on-state.

The scan FF shown in FIG. 4 has a circuit structure different from that of the scan FF according to the first exemplary embodiment, but the function and the operation are identical. Therefore, the description of the operation is omitted here.

As described above, the selector including the transmission gates can be used for the scan FF according to the second exemplary embodiment of the present invention, so that there is an effect that the number of elements is very small and thus a simple circuit structure is obtained.

3. Third Exemplary Embodiment

Figure 5:
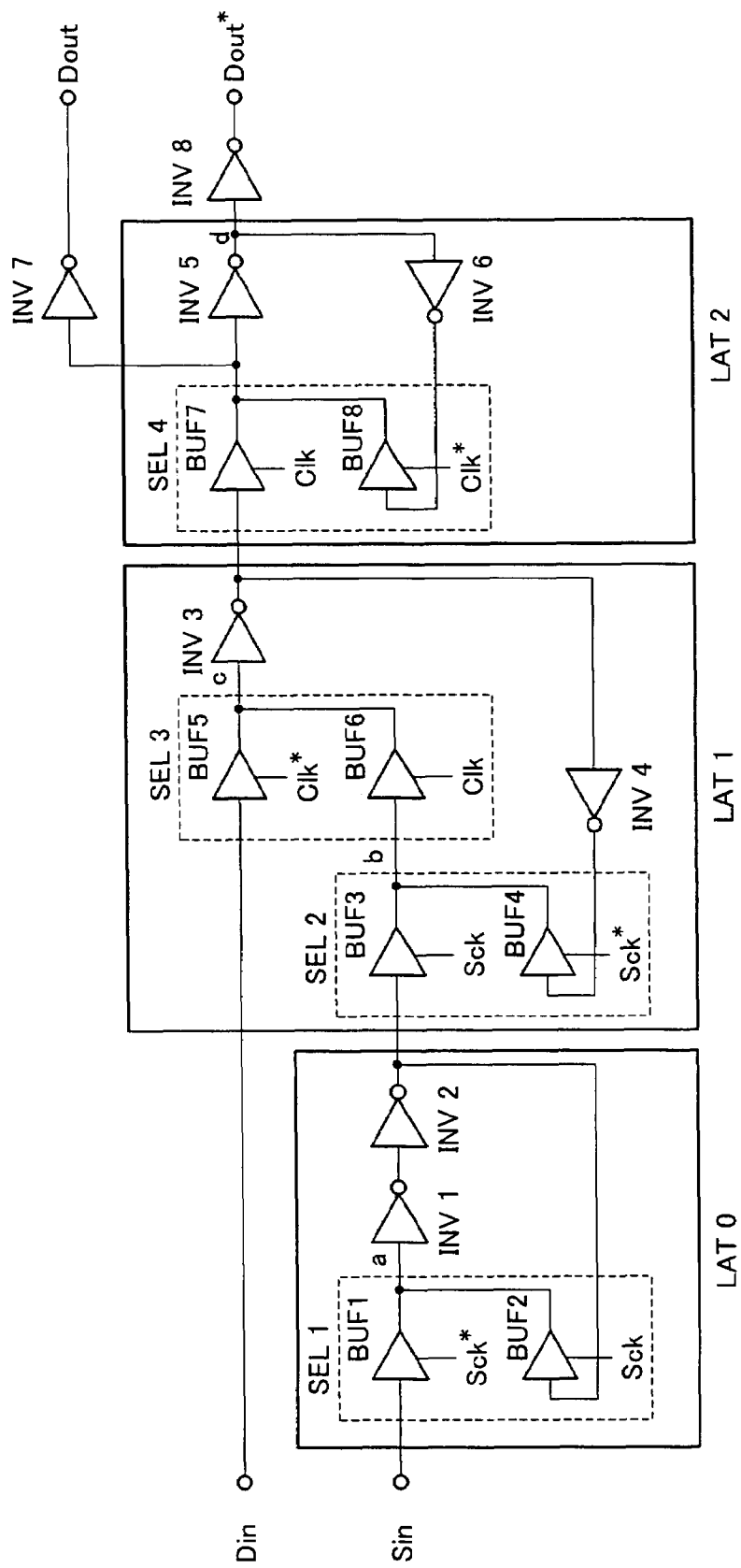
FIG. 5 is a circuit diagram showing an internal structure of a scan FF according to a third exemplary embodiment of the present invention.

In a third exemplary embodiment, a three-state buffer is used for a selector of a scan FF. FIG. 5 shows a selector including two three-state buffers. The three-state buffer is a kind of buffer and includes an input pin, an output pin, and a control pin. When a control input to the control pin is in an active level, the buffer becomes an on-state, so that a signal whose logic level is identical to that of an input signal is outputted to the output pin. When the control input is in an inactive level, the buffer becomes an off-state, so that the output pin becomes a high-impedance state.

When the output pins of the two three-state buffers are connected with each other, a selector including two input pins, an output pin, and two control input pins is completed. Each of SEL 1, SEL 2, SEL 3, and SEL 4 as shown in FIG. 5 is the selector having the above-mentioned structure. Three-state buffers BUF 1 and BUF 2 compose SEL 1. Three-state buffers BUF 3 and BUF 4 compose SEL 2. Three-state buffers BUF 5 and BUF 6 compose SEL 3. Three-state buffers BUF 7 and BUF 8 compose SEL 4. The signals Sck and Sck* are inputted to the two control input pins of SEL 1, so that one of the two three-state buffers is exclusively turned on, that is, only one thereof becomes an on-state. Each of SEL 2, SEL 3, and SEL 4 is connected with one of a group including pins for the signals Sck and Sck* and a group including pins for the signals Clk and Clk*, so that one of the two three-state buffers is exclusively turned on, that is, only one thereof becomes an on-state.

There is a type of generating an inverted input signal as the three-state buffer. This type of three-state buffer is called a clocked inverter. A pin structure of the clocked inverter is identical to that of a normal three-state buffer. The clocked inverter includes an input pin, an output pin, and a clock input pin. When an input clock signal inputted to the clock input pin is in a predetermined logic level, the inverter becomes an on-state, so that a signal whose logic level is identical to that of an inverted input signal is outputted to the output pin. When the input clock signal is in an inactive level, the buffer becomes an off-state, so that the output pin becomes a high-impedance state.

Figure 6:
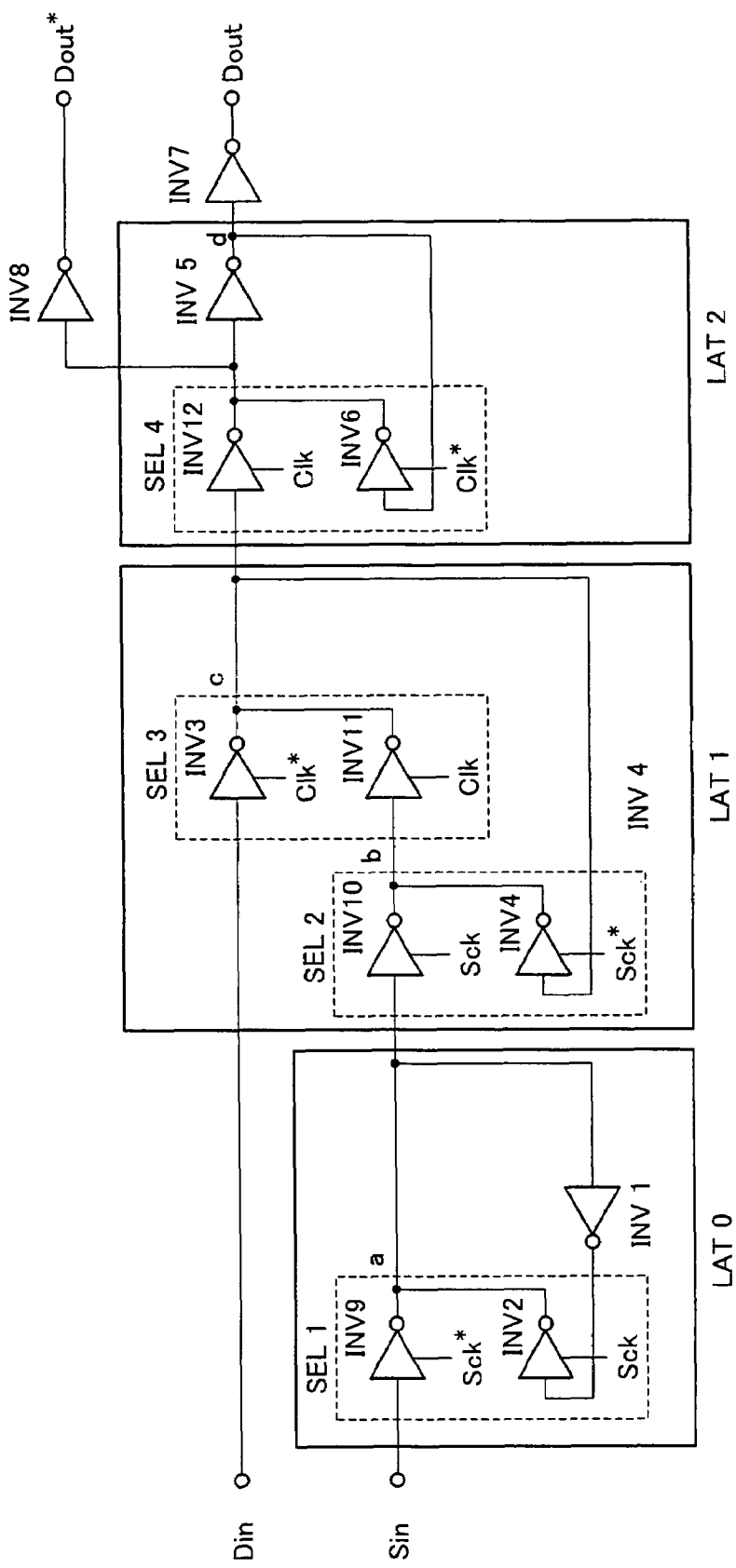
FIG. 6 is a circuit diagram showing a modified example of an internal structure of the scan FF according to the third exemplary embodiment of the present invention.

When the output pins of two clocked inverters are connected with each other, a selector including two input pins, an output pin, and two selection input pins is completed. Each of the selectors SEL 1, SEL 2, SEL 3, and SEL 4 as shown in FIG. 6 is the selector having the above-mentioned structure. Clocked inverters INV 9 and INV 2 compose SEL 1. Clocked inverters INV 10 and INV 4 compose SEL 2. Clocked inverters INV 3 and INV 11 compose SEL 3. Clocked inverters INV 12 and INV 6 compose SEL 4. The signals Sck and Sck* are inputted to the two control input pins of SEL 1, so that one of the two clocked inverters is exclusively turned on, that is, only one thereof becomes an on-state. Each of SEL 2, SEL 3, and SEL 4 is connected with one of a group including pins for the signals Sck and Sck* and a group including pins for the signals Clk and Clk*, so that one of the two clocked inverters is exclusively turned on, that is, only one thereof becomes an on-state.

Each selector section shown in FIG. 6 is fundamentally obtained by replacing a combination of the inverter of the selector section shown in FIG. 5 and the three-state buffer directly connected therewith by a clocked inverter. In order to make a logic level of a signal inputted from Sin to LAT 1 equal to that in the case shown in FIG. 5, an output level of LAT 0 shown in FIG. 6 is reversed to an output level of LAT 0 shown in FIG. 5. With respect to the function of the entire scan FF, the scan FF shown in FIG. 5 is identical to the scan FF shown in FIG. 6.

The scan FF shown in each of FIGS. 5 and 6 has a circuit structure different from that of the scan FF according to each of the first exemplary embodiment and the second exemplary embodiment, but the function and the operation are identical. Therefore, the description of the operation is omitted here.

As described above, the selector including the three-state buffers or the clocked inverters can be used for the scan FF according to the third exemplary embodiment of the present invention. Therefore, a selector having any of various circuit structures can be used. Thus, there is an effect that a suitable circuit structure can be selected according to a use condition.

While this invention has been described in connection with certain exemplary embodiments, it is to be understood that the subject matter encompassed by way of this invention is not to be limited to those specific embodiments. On the contrary, it is intended for the subject matter of the invention to include all alternatives, modifications and equivalents as can be included within the spirit and scope of the following claims.

Further, it is the inventor's intent to retain all equivalents of the claimed invention even if the claims are amended during prosecution.

This application is based on Japanese Patent Application No. 2006-089503 filed on Mar. 28, 2006, and including specification, claims, drawings and summary. The disclosure of the above Japanese Patent Application is incorporated herein by reference in its entirety.

What is claimed is:

1. A flip-flop, comprising:
    a first latch which includes a first feedback circuit which feedbacks a output signal of the first latch to an input of the first latch, and a first selecting circuit which selects a first data input signal of the first latch when a first clock signal is a first logic level and selects an output signal of the first feedback circuit when the first clock signal is a first inverted logic level of the first logic level; and
    a second latch which includes a second feedback circuit which feedbacks a output signal of the second latch to an input of the second latch, and a second selecting circuit which selects an output signal of the first latch when the first clock signal is the first inverted logic level and selects an output signal of the second feedback circuit when the first clock signal is the first logic level;
    wherein the first feedback circuit comprises a third selecting circuit which selects an output signal of the first latch when a second clock signal is a second logic level and selects a second data input signal of the first latch when the second clock signal is a second inverted logic level of the second logic level, and outputs a signal selected by the third selecting circuit to the first selecting circuit.

2. A flip-flop according to claim 1, wherein,
    the flip-flop has a plurality of operation modes including a first operation mode and a second operation mode,
    the second clock signal is fixed to the second logic level, in the first operation mode, and
    the first clock signal changes into the first inverted level from the first level when the second clock signal is the second inverted logic level, and changes into the first level from the first inverted level when the second clock signal is the second logic level, in the second operation mode.

3. A flip-flop according to claim 1, wherein,
    the first latch comprises a first inverter outputting an inverted signal of an output signal of the first selecting circuit to the second latch as the output signal of the first latch,
    the first feedback circuit comprises a second inverter outputting an inverted signal of the output signal of the first latch to the third selecting circuit,
    the second latch comprises a third inverter outputting an inverted signal of an output of the second selecting circuit as the output signal of the second latch, and
    the second feedback circuit comprises a fourth inverter outputting an inverted signal of the output signal of the second latch to the second selecting circuit.

4. A shift register, comprising a plurality of flip-flops according to claim 1.

5. A scan test circuit, comprising a shift register according to claim 4.

6. A control method of a scan test circuit according to claim 5, comprising the steps of:
    setting a logic level of the first clock signal to be the first logic level, and the second signal to be the second level;
    setting the logic level of the second signal to be the second inverted logic level;
    setting the logic level of the first clock signal to be the first inverted logic level;
    setting the logic level of the second signal to be the second logic level; and
    setting the logic level of the first clock signal to be the first logic level.

7. A control method of a shift register according to claim 4, comprising the steps of:
    setting a logic level of the first clock signal to be the first logic level, and the second signal to be the second level;
    setting the logic level of the second signal to be the second inverted logic level;
    setting the logic level of the first clock signal to be the first inverted logic level;
    setting the logic level of the second signal to be the second logic level; and
    setting the logic level of the first clock signal to be the first logic level.

8. A shift register, comprising a first flip-flop and a second flip-flop according to claim 1, wherein
    an output of the first flip-flop is connected with the second data input of the second flip-flop.

9. A control method of a flip-flop according to claim 1, comprising the steps of:
  setting a logic level of the first clock signal to be the first logic level, and the second signal to be the second level;
  setting the logic level of the second signal to be the second inverted logic level;
  setting the logic level of the first clock signal to be the first inverted logic level;
  setting the logic level of the second signal to be the second logic level; and
  setting the logic level of the first clock signal to be the first logic level.

10. A flip-flop, comprising:
  a first latch which includes a first feedback circuit which feedbacks a output signal of the first latch to a input of the first latch, and a first selecting circuit which selects a first data input signal of the first latch when a first clock signal is a first logic level and selects an output signal of the first feedback circuit when the first clock signal is a first inverted logic level of the first logic level;
  a second latch which includes a second feedback circuit which feedbacks a output signal of the second latch to a input of the second latch, and a second selecting circuit which selects an output signal of the first latch when the first clock signal is the first inverted logic level and selects an output signal of the second feedback circuit when the first clock signal is the first logic level; and
  a third latch which includes a third feedback circuit which feedbacks a output signal of the third latch to an input of the third latch, and a third selecting circuit which selects a second input signal of the third latch when a second clock signal is a second logic level and selects an output signal of the third feedback circuit when the second clock signal is the second inverted logic level;
  wherein the first feedback circuit comprises a forth selecting circuit which selects an output signal of the first latch when the second clock signal is the second logic level and selects an output signal of the third latch when the second clock signal is the second inverted logic level, and outputs a signal selected by the forth selecting circuit to the first selecting circuit.

11. A flip-flop according to claim 10, wherein,
  the flip-flop has a plurality of operation modes including a first operation mode and a second operation mode,
  the second clock signal is fixed to the second logic level, in the first operation mode, and
  the first clock signal changes into the first inverted level from the first level when the second clock signal is the second inverted logic level, and changes into the first level from the first inverted level when the second clock signal is the second logic level, in the second operation mode.

12. A flip-flop according to claim 10, wherein,
  the first latch comprises a first inverter outputting an inverted signal of the output signal of the first selecting circuit to the second latch as the output signal of the first latch,
  the first feedback circuit comprises a second inverter outputting an inverted signal of the output signal of the first latch to the third selecting circuit,
  the second latch comprises a third inverter outputting an inverted signal of an output of the second selecting circuit as the output signal of the second latch,
  the second feedback circuit comprises a fourth inverter outputting an inverted signal of the output signal of the second latch to the second selecting circuit,
  the third latch comprises a fifth inverter outputting an inverted signal of an output of the forth selecting circuit, and
  the third feedback circuit comprises a sixth inverter outputting an inverted signal of an output of the sixth inverter to the third selecting circuit as the output signal of the third latch.

13. A shift register, comprising a plurality of flip-flops according to claim 10.

14. A scan test circuit, comprising a shift register according to claim 13.

15. A control method of a scan test circuit according to claim 14, comprising the steps of:
  setting a logic level of the first clock signal to be the first logic level, and the second signal to be the second level;
  setting the logic level of the second signal to be the second inverted logic level;
  setting the logic level of the first clock signal to be the first inverted logic level;
  setting the logic level of the second signal to be the second logic level; and
  setting the logic level of the first clock signal to be the first logic level.

16. A control method of a scan test circuit according to claim 13, comprising the steps of:
  setting a logic level of the first clock signal to be the first logic level, and the second signal to be the second level;
  setting the logic level of the second signal to be the second inverted logic level;
  setting the logic level of the first clock signal to be the first inverted logic level;
  setting the logic level of the second signal to be the second logic level; and
  setting the logic level of the first clock signal to be the first logic level.

17. A shift register, comprising a first flip-flop and a second flip-flop according to claim 10, wherein
  an output of the first flip-flop is connected with the second data input of the second flip-flop.

18. A control method of a flip-flop according to claim 10, comprising the steps of:
  setting a logic level of the first clock signal to be the first logic level, and the second signal to be the second level;
  setting the logic level of the second signal to be the second inverted logic level;
  setting the logic level of the first clock signal to be the first inverted logic level;
  setting the logic level of the second signal to be the second logic level; and
  setting the logic level of the first clock signal to be the first logic level.

19. A flip-flop, comprising:
  a first latch including a first feedback circuit, a first selecting circuit and a second selecting circuit; and
  a second latch including a second feedback circuit and a third selecting circuit,
  wherein the first selecting circuit inputs a first data input signal of the first latch and an output signal of the second selecting circuit and selects one of the first data input signal and the output signal of the second selecting circuit according to a logic level of a first clock signal to output to the second latch and the first feedback circuit,
  wherein the second selecting circuit inputs a second data input signal of the first latch and an output signal of the first feedback circuit being fed back and selects one of the second data input signal and the output signal of the first feedback circuit according to a logic level of a second clock signal to output to the first selecting circuit, and wherein the third selecting circuit inputs an output signal of the first latch and an output signal of the second feedback circuit being fed back and selects one of the output signal of the first latch and the output signal of the second feedback circuit according to an inverted condition of the logic level of the first clock signal used in the first latch to output to the second feedback circuit.

20. A flip-flop, comprising:

a first latch including a first feedback circuit, a first selecting circuit and a second selecting circuit; and a second latch including a second feedback circuit and a third selecting circuit, wherein an input of the first feedback circuit is coupled with an output of the first latch wherein an output of the first selecting circuit is coupled with the output of the first latch, wherein a feedback output of the first feedback circuit is coupled with one of inputs of the second selecting circuit, wherein an output of the second selecting circuit is coupled with one of inputs of the first selecting circuit, wherein a first data input of the first latch is coupled with another input of the first selecting circuit, and wherein a second data input of the first latch is coupled with another input of the second selecting circuit, wherein the first selecting circuit selects one of the first data input and the output of the second selecting circuit according to a logic level of a first clock signal, wherein the second selecting circuit selects one of the second data input and the feedback output of the first feedback circuit according to a logic level of a second clock signal, wherein an output of the third selecting circuit is coupled with an output of the second latch, wherein an input of the second feedback circuit is coupled with the output of the second latch, wherein a feedback output of the second feedback circuit is coupled with one of inputs of the third selecting circuit, wherein an output of the first latch is coupled with another input of the third selecting circuit, wherein the third selecting circuit selects one of the output of the second feedback circuit and the output of the first latch according to an inverted condition of the logic level of the first clock signal used in the first latch.

\* \* \* \* \*